United States Patent
Fukushima

(10) Patent No.: US 7,061,293 B2
(45) Date of Patent: Jun. 13, 2006

(54) SPREAD SPECTRUM CLOCK GENERATING CIRCUIT

(75) Inventor: Takahito Fukushima, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 12 days.

(21) Appl. No.: 10/985,953

(22) Filed: Nov. 12, 2004

(65) Prior Publication Data

US 2005/0127975 A1    Jun. 16, 2005

(30) Foreign Application Priority Data

Nov. 13, 2003    (JP) .............................. 2003-383374

(51) Int. Cl.
*H03K 3/00*    (2006.01)

(52) U.S. Cl. ...................... 327/291; 327/113; 327/114; 327/299

(58) Field of Classification Search ................ 327/113, 327/114, 291, 293, 294, 299
See application file for complete search history.

(56) References Cited

U.S. PATENT DOCUMENTS

| | | | | |
|---|---|---|---|---|
| 5,682,114 A | * | 10/1997 | Ohta | ........................... 327/276 |
| 5,939,919 A | * | 8/1999 | Proebsting | ................... 327/295 |
| 6,518,813 B1 | | 2/2003 | Usui | ........................... 327/271 |

* cited by examiner

*Primary Examiner*—Kenneth B. Wells
*Assistant Examiner*—Khareem E. Almo
(74) *Attorney, Agent, or Firm*—Oliff & Berridge, PLC

(57) ABSTRACT

A clock generating circuit includes a delay circuit which has input terminals and which delays a signal input from each of the input terminals by a different delay time, and outputs the delayed signal from at least one output terminal, a selective circuit which receives an input clock signal and selectively outputs the clock signal to one of the input terminals of the delay circuit, and a control circuit which switches selective operations of the selective circuit. A modulated clock signal in which the period of the clock signal is increased or decreased is output from the at least one output terminal of the delay circuit such that the control circuit sequentially switches the selective operations of the selective circuit.

18 Claims, 4 Drawing Sheets

SPREAD SPECTRUM CLOCK GENERATING CIRCUIT

BACKGROUND OF THE INVENTION

1. Field of Invention

The present invention relates to a spread spectrum clock generating circuit for reducing an electromagnetic interference (EMI) noise.

2. Description of Related Art

An EMI noise is an electromagnetic noise emitted from an electronic device. When the EMI noise is enhanced, it generally has a negative influence on any peripheral devices. Accordingly, for each frequency band, a regulation level is established. A common digital electronic device operates by clocks having a predetermined frequency. Normally, the clocks are in rectangular waveform, so that not only a fundamental wave noise, but also second and higher harmonics component noises are generated. In order to prevent these noises, a particular measure is generally required.

Conventionally, an analog PLL (phase-locked loop) circuit is used as a spread spectrum clock generating circuit in order to prevent EMI noise. However, as a result, a period in frequency variation is increased and accumulative delays for fundamental waves are increased. Therefore, the analog PLL circuit is generally not suitable for use in a semiconductor integrated circuit.

Accordingly, considering an application such as, for example an ASIC (application specific integrated circuit) or the like, the spread spectrum clock generating circuit shown in FIG. 4 has been proposed (see, for example, PCT International Publication WO00/45246). Referring to FIG. 4, a delay circuit 50 is constituted by delay buffers 51 to 54 which are cascade-connected to an input clock signal CLKIN. A selective circuit 60 receives the clock output from the delay buffers 51 to 54 in the delay circuit 50 and selects one clock as an output clock CLKOUT. A control circuit 70 receives a delayed clock signal because the clock output from the delay buffer 54 at the final stage is delayed by a delay buffer 71 in the selective circuit 60. The control circuit 70 also controls a selective operation of the selective circuit 60 by using predetermined bit signals.

In the clock generating circuit shown in FIG. 4, the control circuit 70 supplies the selective circuit 60 with combined bit signals so as to cycle in a predetermined period, and a clock period is increased or decreased by the combined bit signals, whereby the period of the output clock CLKOUT can be increased or decreased and a frequency spectrum distribution can thus be spread. This generally results in the reduction of an EMI noise.

The clock generating circuit in FIG. 4 uses the delay circuit 50, which has plural output terminals. Thus, at connection points (output points) in post-stages of switch portions of the selective circuit 60, there are generally large parasitic capacitive loads. Accordingly, the ability of the delay buffers 51 to 54 to drive the output terminals must be increased. This causes various problems such as, for example, an increase in circuit area, an increase in power consumption, and increased jitter due to an increased minimum delay step. The jitter means that modulation is performed beyond frequency modulation required for EMI-noise prevention, and clock performance is thus affected.

SUMMARY OF THE INVENTION

It is an object of the present invention to provide a clock generating circuit having a small driving ability of a delay circuit, a reduced circuit area, reduced power consumption, a reduced delay step, and, in addition, a reduced clock jitter.

To achieve the above object, the present invention provides an exemplary clock generating circuit that includes a delay circuit having a plurality of input terminals and at least one output terminal, for delaying a signal input from each of the input terminals by a different delay time and outputting the delayed signal from the at least one output terminal, a selective circuit for receiving an input clock signal and selectively outputting the clock signal to one of the input terminals of the delay circuit, and a control circuit for switching selective operations of the selective circuit. In the clock generating circuit, a modulated clock signal in which the period of the clock signal is increased or decreased and which is frequency-modulated is output from the at least one output terminal of the delay circuit such that the control circuit sequentially switches the selective operations of the selective circuit.

Alternatively, the exemplary delay circuit includes a plurality of logic gates which are cascade-connected and serve as delay elements, and one input terminal of each of at least two logic gates among the plurality of logic gates is used as one of the plurality of input terminals.

Alternatively, the exemplary selective circuit switches the selective operations in synchronization with the input clock signal.

Also, the exemplary of logic gates in the delay circuit have equal delay times, and, in the exemplary selective circuit, a logic gate identical to each of the logic gates in the delay circuit is used as an element for selecting one of the input terminals in the delay circuit.

In the exemplary clock generating circuit, the control circuit may switch the selective operations so that the selective circuit repeatedly performs, in a predetermined period, a cyclic use of the input terminals in predetermined order.

According to exemplary implementations of the present invention, a delay time of a clock signal is selected on an input side of a delay circuit and is not selected on an output side of the delay circuit, thus reducing the driving ability of the delay circuit. This enables a reduced circuit area, a reduction in power consumption, and a reduction in minimum delay step. Therefore, frequency modulation can be performed without causing a problem with jitter.

DETAILED DESCRIPTION OF PREFERRED EMBODIMENTS

Figure 1:
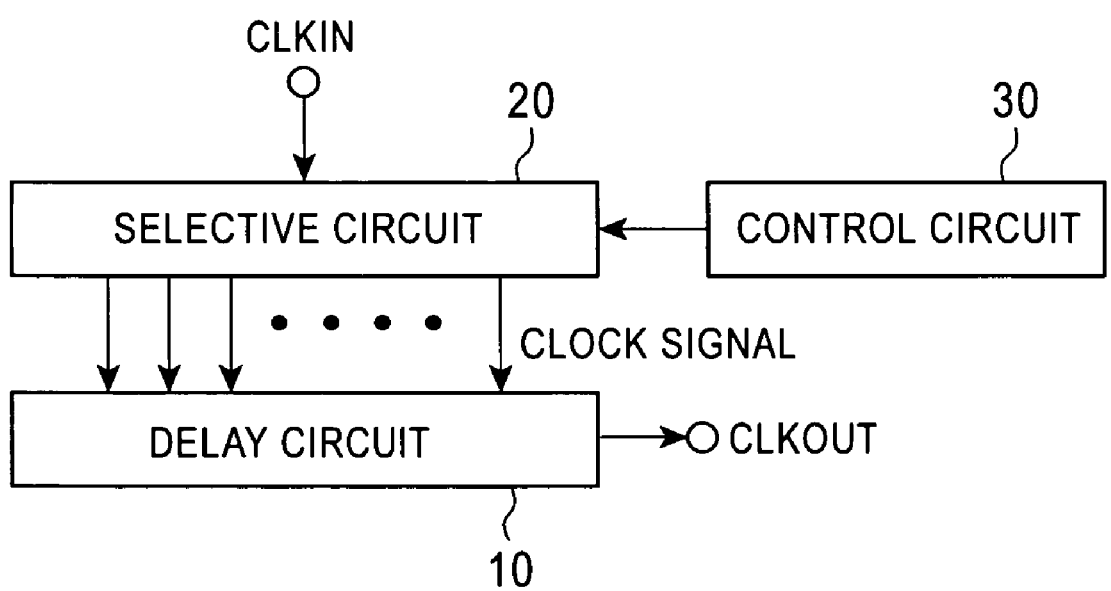
FIG. 1 is a block diagram illustrating the principle of an exemplary clock generating circuit, according to various implementations of the present invention.

FIG. 1 is a block diagram illustrating the principle of an exemplary clock generating circuit according to various implementations of the present invention. In FIG. 1, a delay circuit 10 has plural input terminals. The delay circuit 10 delays signals input from the input terminals by different delay times, and outputs a delayed signal from at least one output terminal. According to various implementations, a selective circuit 20 receives an input clock signal CLKIN and selectively outputs the signal to one of the input terminals of the delay circuit 10. According to various implementations, a control circuit 30 switches selective operations of the selective circuit 20. In the exemplary case shown in FIG. 1, the control circuit 30 sequentially switches the selective operations of the selective circuit 20, whereby a modulated clock signal, in which a clock signal period is increased or decreased and is frequency-modulated, is output from the output terminal of the delay circuit 10.

As described above, regarding the exemplary delay circuit 10, the clock signal can be switched by the selective circuit 20 on its input side, and the delay circuit 10 outputs the frequency-modulated clock signal from at least one output terminal. Thus, the parasitic capacitive loads of the output terminals of the delay buffers in the delay circuit 10 can be reduced to their minimum, and the driving ability of the delay buffers can be reduced. In other words, it is only necessary to match a post-stage circuit which inputs an output clock signal CLKOUT. The present invention is described in detail in the following exemplary embodiments.

First Exemplary Embodiment

Figure 2:
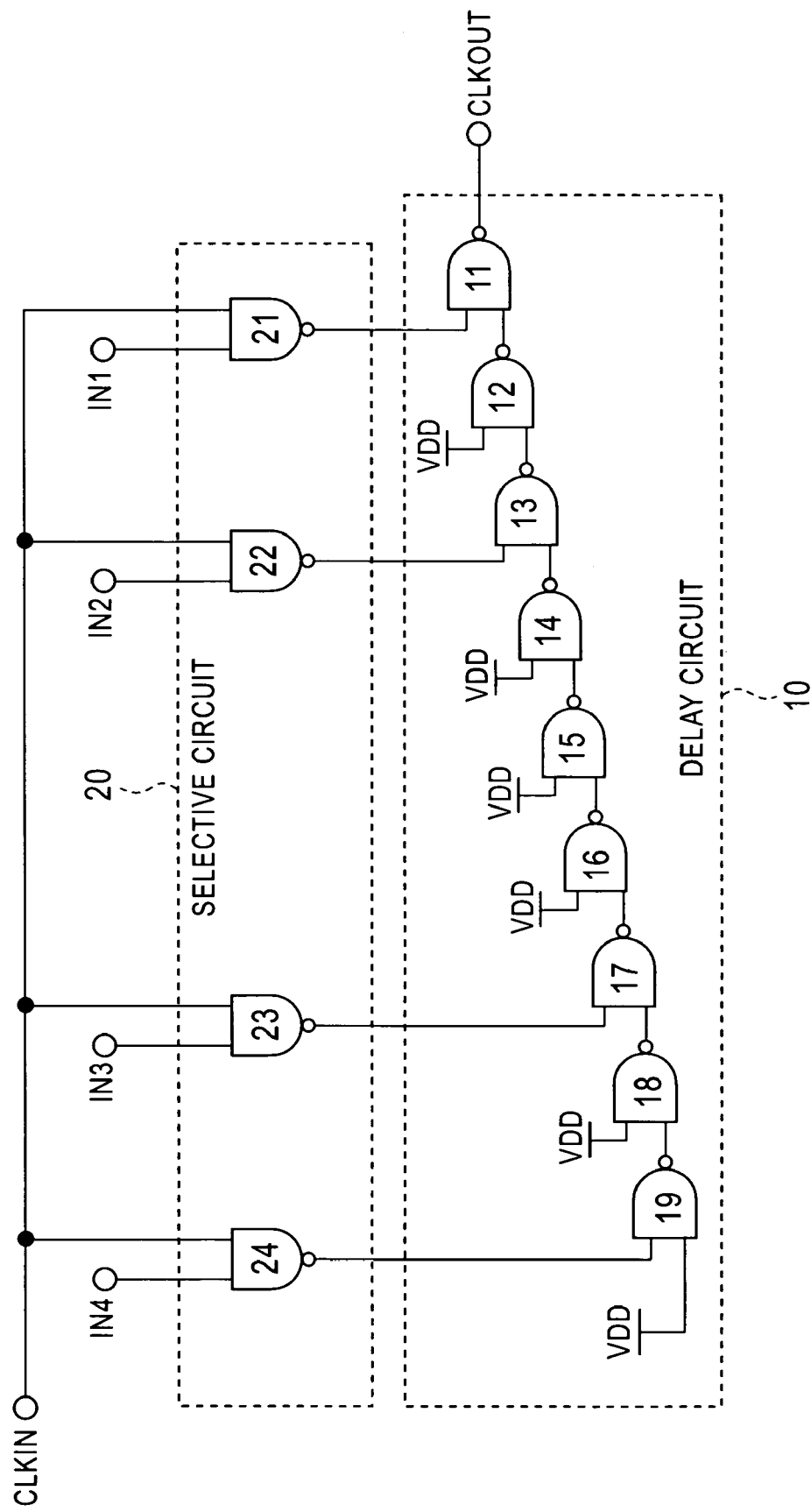
FIG. 2 is a block diagram showing an exemplary clock generating circuit according to a first embodiment of the present invention.

FIG. 2 is a specific exemplary block diagram showing a clock generating circuit according to a first exemplary embodiment of the present invention. A delay circuit 10 is constituted by nine two-input NAND gates 11 to 19 which are cascade-connected. A selective circuit 20 is constituted by four two-input NAND gates 21 to 24. Each output of the NAND gates 21 to 24 in the selective circuit 20 is connected to one input terminal of each of the NAND gates 11, 13, 17, and 19 in the delay circuit 10. A clock signal CLKIN is input to one input terminal of each of the NAND gates 21 to 24 in the selective circuit 20, and control signals IN1 to IN4 from a control circuit 30 (not shown in FIG. 2 and including a shift register and a binary counter) are input to the other input terminals of the NAND gates 21 to 24. In this exemplary clock generating circuit, the NAND gates 11 to 19 in the delay circuit 10 serve as delay elements, while the NAND gates 21 to 24 in the selective circuit 20 serve both as delay elements and switches.

According to various exemplary implementations, the NAND gates 11 to 19 and 21 to 24 have equal delay times. In each of the NAND gates 12, 14, 15, 16, and 18, the other input terminal is set to be at an "H" level (VDD) to consider output signal duty. However, both input terminals of each NAND gate 12, 14, 15, 16, and 18 may be connected to an output terminal of the NAND gate at the previous stage. In other words, the NAND gates 12, 14, 15, 16, and 18 may be inverters.

According to various exemplary implementations, when one of the control signals IN1 to IN4 is at the "H" level (VDD), and the other control signals are in an "L" level (GND), the control signal in the "H" level is input to open one NAND gate in the selective circuit 20. Thus, the clock signal passes through the NAND gate, is input to a corresponding NAND gate and is delayed in the delay circuit 10, then is output from its output terminal. In this case, the NAND gates through which the clock signal passes have an even number of stages. Accordingly, the output clock signal CLKOUT is obtained by delaying the input clock signal for the number of stages of NAND gates through which the input clock signal passes.

For example, when the control signal IN2 is at the "H" level, and other control signals IN1, IN3, and IN4 are at the "L" level, the input clock signal passes through the NAND gates 22, 13, 12, and 11 in this order, that is, four NAND gates, and becomes the output clock signal CLKOUT. In addition, when the control signal IN1 is at the "H" level, and other control signals IN2 to IN4 are at the "L" level, the input clock signal passes through the NAND gates 21 and 11, that is, two NAND gates, and becomes the output clock signal CLKOUT. In the former case, the input clock signal passes through the four NAND gates. Thus, compared with the latter case, the clock signal is delayed by two NAND gates.

As described above, the output clock signal CLKOUT has a different delay time in response to the control signals IN1 to IN4. When a delay time by one NAND gate is represented by t, selection of the control signal IN1 produces a delay time of 2t, selection of the control signal IN2 produces a delay time of 4t, selection of the control signal IN3 produces a delay time of 8t, and selection of the control signal IN4 produces a delay time of 10t.

Figure 3A:
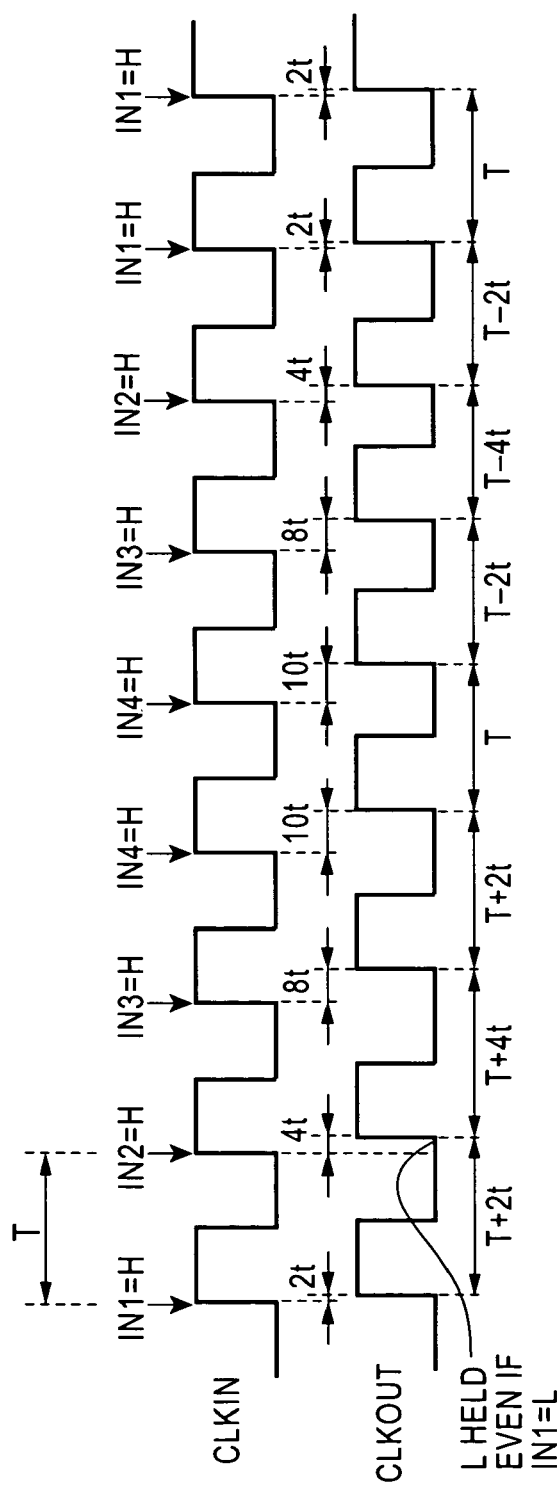
FIGS. 3A and 3B are time charts illustrating an exemplary operation of the clock generating circuit shown in FIG. 2.
Figure 3B:
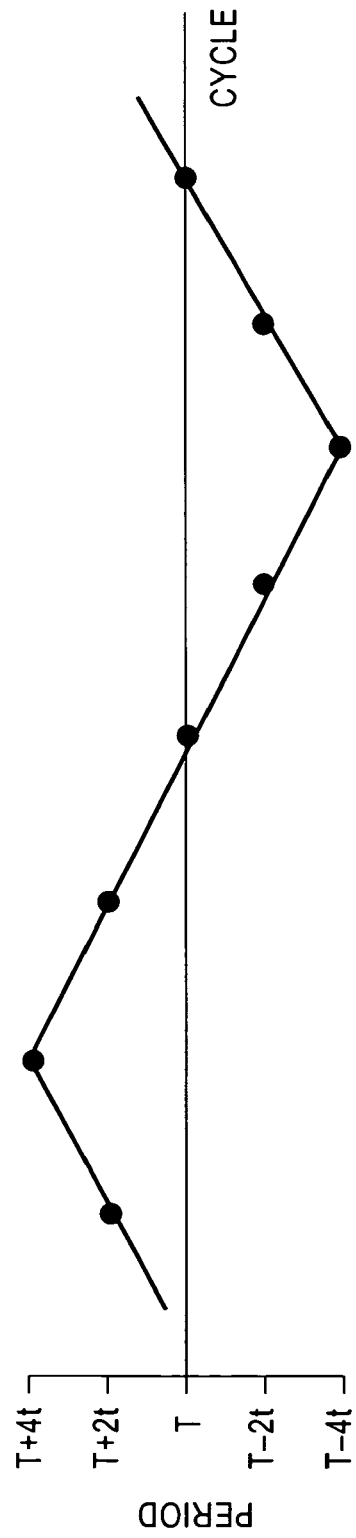
Figure 4:
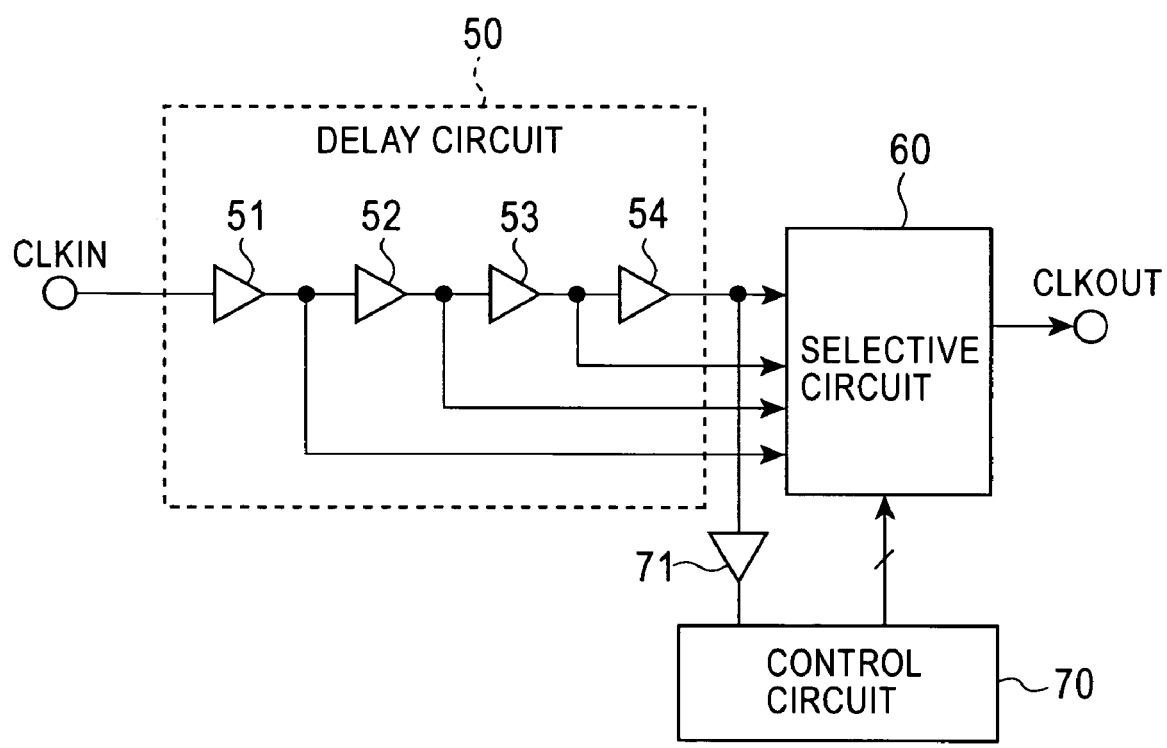
FIG. 4 is a block diagram showing a conventional clock generating circuit.

Accordingly, in order to perform frequency modulation by using the clock signals having different delay times, the control signals IN1 to IN4 may be switched in synchronization with a rise of the input clock signal CLKIN. For example, when repeatedly switching the control signals in the order of IN1, IN2, IN3, IN4, IN4, IN3, IN2, IN1, IN1, . . . , the exemplary time charts shown in FIGS. 3A and 3B are obtained. In FIGS. 3A and 3B, T represents the period of the input clock signal CLKIN. In this case, a changing width (delay step) in the period of each clock is a constant value of 2t, and a variation (whose reciprocal is a variation in frequency) in period of the output clock signal CLKOUT, that is, a profile, is in the form of a triangular wave. By differing the delay steps, desired frequency modulation profiles, such as sawtooth waves and sinusoidal waves, can be realized.

According to the first exemplary embodiment, as it is not necessary to particularly enhance the driving ability of each delay element in the delay circuit 10, there is no increase in the circuit area of the delay circuit 10. Accordingly, current consumption can also be reduced. Furthermore, as the driving ability can be suppressed, the minimum delay step can be reduced, so that the problem of clock jitter can be avoided.

Second Exemplary Embodiment

Although the first exemplary embodiment uses two-input NAND gates as delay elements, the delay elements are not limited to two-input NAND gates, and other logic gates such as NOR gates may be used as delay elements. When two-input NOR gates are used as delay elements and switches in the exemplary selective circuit 20, by setting one of the control signals IN1 to IN4 at the "L" level, the two-input NOR gate, to which the control signal are set to the "L" level, is opened and the input clock signal that is input to the other input terminal is inverted and output. In the first exemplary embodiment, by providing the NAND gates 21 to 24 in the selective circuit 20 with delay times equivalent to those provided by the NAND gates 11 to 19 in the delay circuit 10, a reduced number of stages of the delay elements can be achieved. However, in cases in which it is not necessary to consider a reduction in the number of stages, any delay times may be used. For example, ordinary analog switches can be used in place of the NAND gates 21 to 24.

While the invention has been described in conjunction with exemplary implementations, these implementations should be viewed as illustrative, not limiting. Variations, modifications, substitutes, or the like are possible within the spirit and scope of the invention.

What is claimed is:

1. A clock generating circuit comprising:
   a delay circuit having a plurality of input terminals and at least one output terminal, for delaying a signal input from each of the input terminals by a different delay time and outputting the delayed signal from said at least one output terminal;
   a selective circuit for receiving an input clock signal and selectively outputting the clock signal to one of the plurality of input terminals of said delay circuit; and
   a control circuit for switching selective operations of the selective circuit.

2. The clock generating circuit according to claim 1, said control circuit switches the selective operations so that said selective circuit repeatedly performs, in a predetermined period, cyclic use of the plurality of input terminals in predetermined order.

3. The clock generating circuit according to claim 2, said delay circuit comprises a plurality of logic gates which are cascade-connected and which serve as delay elements.

4. The clock generating circuit according to claim 3, one input terminal of each of at least two logic gates among said plurality of logic gates is used as one of said plurality of input terminals of the delay circuit.

5. The clock generating circuit according to claim 4, wherein said selective circuit switches the selective operations in synchronization with the input clock signal.

6. The clock generating circuit according to claim 5, wherein said plurality of logic gates in said delay circuit have equal delay times.

7. The clock generating circuit according to claim 6, wherein, in said selective circuit, a logic gate identical to each of the logic gates in said delay circuit is used as an element for selecting one of the input terminals in said delay circuit.

8. The clock generating circuit according to claim 4, wherein each of said plurality of logic gates is one of a two-input NAND gate and a two-input NOR gate.

9. The clock generating circuit according to claim 7, wherein each of said plurality of logic gates is one of a two-input NAND gate and a two-input NOR gate.

10. A clock generating circuit comprising:
    a delay circuit having a plurality of input terminals and at least one output terminal, for delaying a signal input from each of the input terminals by a different delay time and outputting the delayed signal from said at least one output terminal;
    a selective circuit for receiving an input clock signal and selectively outputting the clock signal to one of the input terminals of said delay circuit; and
    a control circuit for switching selective operations of the selective circuit,
    wherein a modulated clock signal in which the period of the clock signal is increased or decreased is output from said at least one output terminal of the delay circuit.

11. The clock generating circuit according to claim 10, wherein said control circuit switches the selective operations so that said selective circuit repeatedly performs, in a predetermined period, cyclic use of the input terminals in a predetermined order.

12. The clock generating circuit according to claim 11, said delay circuit comprising a plurality of logic gates which are cascade-connected and which serve as delay elements.

13. The clock generating circuit according to claim 12, one input terminal of each of at least two logic gates among said plurality of logic gates being used as one of said plurality of input terminals of the delay circuit.

14. The clock generating circuit according to claim 13, wherein said selective circuit switches the selective operations in synchronization with the input clock signal.

15. The clock generating circuit according to claim 14, wherein said plurality of logic gates in said delay circuit have equal delay times.

16. The clock generating circuit according to claim 15, wherein, in said selective circuit, a logic gate identical to each of the logic gates in said delay circuit is used as an element for selecting one of the input terminals in said delay circuit.

17. The clock generating circuit according to claim 13, wherein each of said plurality of logic gates is one of a two-input NAND gate and a two-input NOR gate.

18. The clock generating circuit according to claim 16, wherein each of said plurality of logic gates is one of a two-input NAND gate and a two-input NOR gate.

* * * * *